US010389453B2

(12) United States Patent
Rumreich

(10) Patent No.: US 10,389,453 B2
(45) Date of Patent: Aug. 20, 2019

(54) MULTIPLEXED RFAGC FOR FREQUENCY DIVERSITY RECEIVERS

(75) Inventor: Mark Francis Rumreich, Marion, IN (US)

(73) Assignee: INTERDIGITAL MADISON PATENT HOLDINGS, Paris (FR)

(*) Notice: Subject to any disclaimer, the term of this patent is extended or adjusted under 35 U.S.C. 154(b) by 1148 days.

(21) Appl. No.: 13/515,854

(22) PCT Filed: Dec. 15, 2009

(86) PCT No.: PCT/US2009/006547
§ 371 (c)(1),
(2), (4) Date: Jun. 14, 2012

(87) PCT Pub. No.: WO2011/075097
PCT Pub. Date: Jun. 23, 2011

(65) Prior Publication Data
US 2012/0299672 A1 Nov. 29, 2012

(51) Int. Cl.
H04B 1/06 (2006.01)
H04B 7/00 (2006.01)
H04B 10/69 (2013.01)
H03G 1/00 (2006.01)
H03G 3/30 (2006.01)

(52) U.S. Cl.
CPC ....... *H04B 10/6931* (2013.01); *H03G 1/0088* (2013.01); *H03G 3/3052* (2013.01)

(58) Field of Classification Search
CPC .. H04B 10/6931; H04B 10/69; H04B 1/0088; H04B 3/3052

USPC ............ 455/232.1, 234.1–234.2, 245.1, 138; 330/1 R, 67, 185
See application file for complete search history.

(56) References Cited

U.S. PATENT DOCUMENTS

| | | |
|---|---|---|
| 3,676,792 A | 7/1972 | Newton |
| 3,733,431 A | 5/1973 | Kirk et al. |
| 4,641,141 A | 2/1987 | Masak |
| 4,849,711 A | 7/1989 | Leis et al. |
| 5,200,826 A | 4/1993 | Seong |

(Continued)

FOREIGN PATENT DOCUMENTS

| | | |
|---|---|---|
| EP | 1653608 | 5/2006 |
| GB | 776062 | 6/1957 |

(Continued)

OTHER PUBLICATIONS

ROC (Taiwan) Search Report for Patent Application No. 099143814 dated Feb. 10, 2014.

(Continued)

*Primary Examiner* — Md K Talukder
(74) *Attorney, Agent, or Firm* — Brian J. Dorini, Esquire; Robert D. Shedd, Esquire

(57) ABSTRACT

The present invention concerns a system for controlling gain when time-sharing a tuner in a frequency diversity receiver. Two radio-frequency automatic gain control (RFAGC) filter capacitors are used, each capacitor corresponding to one of the currently utilized frequencies in the frequency diversity scheme. The capacitors are switched in tandem with the tuner frequency selection. This allows the capacitor associated with a tuned frequency to retain the RFAGC voltage until the tuner returns to that frequency.

6 Claims, 3 Drawing Sheets

(56) References Cited

U.S. PATENT DOCUMENTS

| | | | |
|---|---|---|---|
| 5,402,448 A * | 3/1995 | Marko et al. | 375/340 |
| 5,745,847 A | 4/1998 | Matsuo | |
| 6,348,955 B1 | 2/2002 | Tait | |
| 6,721,368 B1 * | 4/2004 | Younis | H03G 1/0088 |
| | | | 330/129 |
| 2002/0163979 A1 * | 11/2002 | Takatz | H03G 3/3052 |
| | | | 375/345 |
| 2003/0193618 A1 | 10/2003 | Patel et al. | |
| 2006/0222115 A1 | 10/2006 | Dornbusch et al. | |
| 2007/0115801 A1 * | 5/2007 | Li et al. | 370/208 |
| 2012/0299672 A1 * | 11/2012 | Rumreich | H03G 1/0088 |
| | | | 334/39 |
| 2018/0033815 A1 * | 2/2018 | Chalmers, Jr. | G01J 1/0488 |

FOREIGN PATENT DOCUMENTS

| | | |
|---|---|---|
| JP | 60090494 | 5/1985 |
| JP | 6261328 | 9/1994 |

OTHER PUBLICATIONS

Aschwanden, Felix, "Direct conversion-how to make it work in TV tuners," Consumer Electronics, IEEE Transactions on 42.3 (1996): 729-738.

Gatta, Francesco, et el. "An embedded 65 nm CMOS baseband IQ 48 MHz Œ 1 GHz dual tuner for DOCSIS 3.0," Solid-State Circuits, IEEE Journal of 44.12 (2009): 3511-3525.

Vogt, L., et al. "A two-chip digital car radio." Solid-State Circuits Conference, 1996. Digest of Technical Papers. 42nd ISSCC., 1996 IEEE International. IEEE, 1996.

ROC (Taiwan) Search Report for Patent Application No. 099143814 dated Feb. 10, 2014 [English Translation ].

\* cited by examiner

MULTIPLEXED RFAGC FOR FREQUENCY DIVERSITY RECEIVERS

This application claims the benefit, under 35 U.S.C. §365 of International Application PCT/US2009/006547, filed Dec. 15, 2009, which was published in accordance with PCT Article 21(2) on Jun. 23, 2011 in English.

BACKGROUND OF THE INVENTION

The present invention generally relates to a system for controlling gain when time-sharing a tuner in a frequency diversity receiver. Two radio-frequency automatic gain control (RFAGC) filter capacitors are used, each capacitor corresponding to one of the currently utilized frequencies in the frequency diversity scheme. The capacitors are switched in tandem with the tuner frequency selection. This allows the capacitor associated with a tuned frequency to retain the RFAGC voltage until the tuner returns to that frequency.

This section is intended to introduce the reader to various aspects of art, which may be related to various aspects of the present invention that are described below. This discussion is believed to be helpful in providing the reader with background information to facilitate a better understanding of the various aspects of the present invention. Accordingly, it should be understood that these statements are to be read in this light, and not as admissions of prior art.

Over-the-air television broadcasts have been gradually transitioning from analog to digital standards. In the United States, television transmissions have transitioned from the analog NTSC system to the digital ATSC system.

While ATSC signals can be reliably received at many fixed locations, reception by mobile receivers is highly problematic. Various extensions and modifications to the ATSC standard have been proposed to allow reliable reception at mobile receivers. Most provide backwards compatibility with ATSC, but employ various modulation, transmission, encoding, and redundancy techniques to assist mobile reception.

One such technique is the use of frequency diversity. With frequency diversity, the same information may be transmitted using signals on multiple carrier frequencies, such that when the information cannot be recovered from one of the signals, it might be recovered from the other. Frequency diversity provides improved immunity to multipath, which is a key factor in mobile reception difficulties. Reception can still be possible even if one of the frequency channels is unusable because of severe multipath impairment.

A common approach for reception in a frequency diversity system is to use two separate tuners and demodulator front-ends. This approach, however, can be cost-prohibitive. Sharing a single tuner and front-end could save money and reduce the physical size of the receiver electronics, but may create performance problems since there may not be enough time for robust signal acquisition each time the received channel frequency is changed. In particular, the time required to establish a radio-frequency automatic gain control (RFAGC) level may exceed the time available. A frequency diversity reception system is needed that provides the cost advantages of a single tuner system, but mitigates the performance issues related to signal acquisition. The invention described herein addresses this and/or other problems.

SUMMARY OF THE INVENTION

In order to solve the problems described above, the present invention concerns a system for controlling gain when time-sharing a tuner in a frequency diversity receiver. Two radio-frequency automatic gain control (RFAGC) filter capacitors are used, each capacitor corresponding to one of the currently utilized frequencies in the frequency diversity scheme. The capacitors are switched in tandem with the tuner frequency selection. This allows the capacitor associated with a tuned frequency to retain the RFAGC voltage until the tuner returns to that frequency. This and other aspects of the invention will be described in detail with reference to the accompanying Drawings.

BRIEF DESCRIPTION OF THE DRAWINGS

The above-mentioned and other features and advantages of this invention, and the manner of attaining them, will become more apparent, and the invention will be better understood, by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

As described herein, the present invention provides a system for controlling gain when time-sharing a tuner in a frequency diversity receiver. Two radio-frequency automatic gain control (RFAGC) filter capacitors are used, each capacitor corresponding to one of the currently utilized frequencies in the frequency diversity scheme. The capacitors are switched in tandem with the tuner frequency selection. This allows the capacitor associated with a tuned frequency to retain the RFAGC voltage until the tuner returns to that frequency.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The present invention may be implemented in the signal tuning electronics of a television set-top box, a television with an internal tuner, or other tuning hardware such as a USB tuner or a tuner within a cellular phone.

Figure 1:
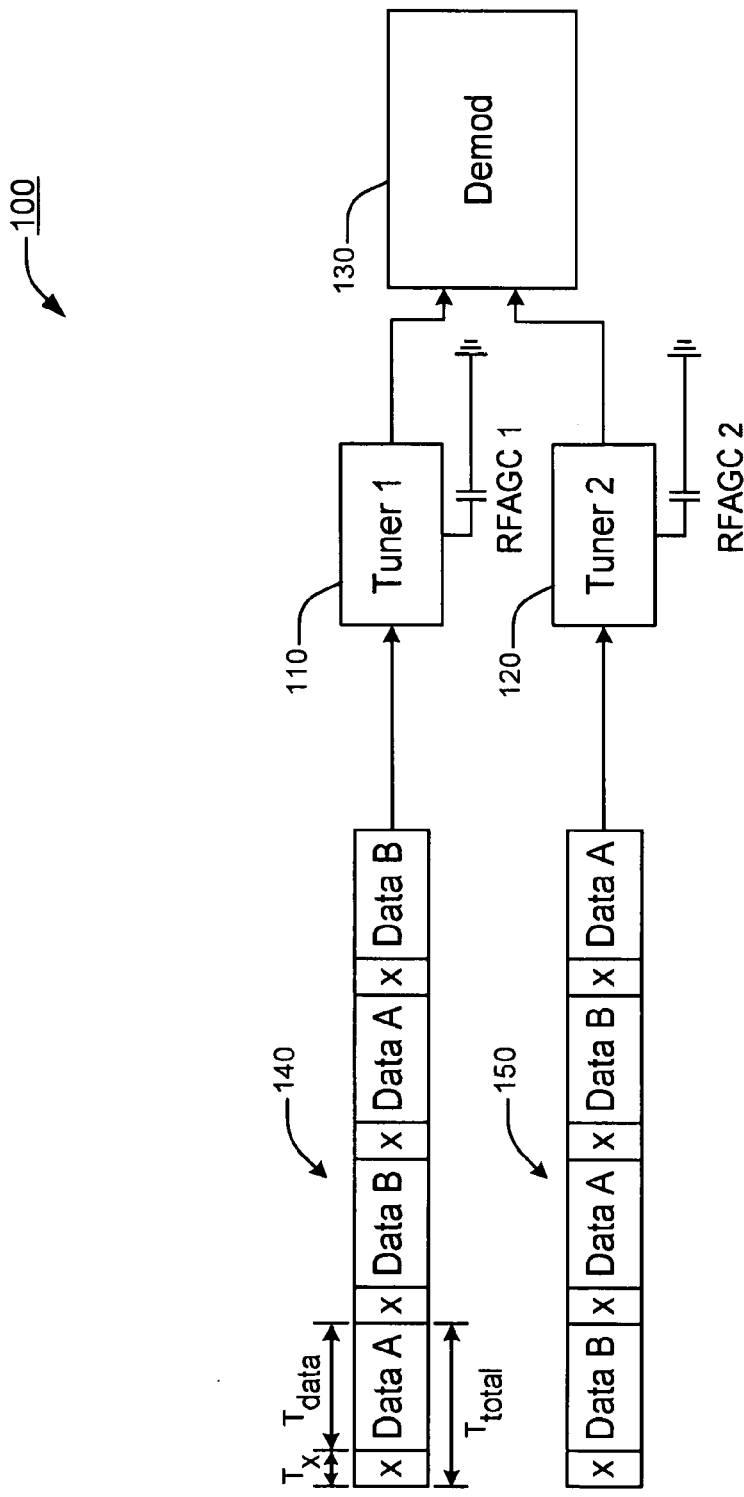
FIG. 1 is a block diagram of a portion of a television reception system with dual tuners for use in a frequency diversity transmission system.

FIG. 1 is a block diagram of a conventional frequency diversity receiver using two tuners 110 and 120 and a single demodulator 130. In this example, two carrier frequencies are used for transmitting two separate multiplexed data streams 140 and 150. Each multiplexed data stream 140 and 150 comprises data from multiple primary data streams, in this example, data streams A and B. The receiver is able to recover the complete data stream A or B from either the signal carried on the first frequency or the signal carried on the second frequency because of intentional redundancy.

During reception, tuner 110 is tuned to the first frequency and tuner 120 is tuned to the second frequency. The RFAGC of each tuner dynamically tracks the signal level of its respective signal, with a time constant on the order of hundreds of milliseconds, to optimize noise-figure and/or intermodulation performance. To recover data stream A, the demodulator block 130 switches between the outputs of tuner 110 and tuner 120 in order to extract the data stream A segments from the signals at both frequencies. Similarly, to recover data stream B, the demodulator block 130 switches between the outputs of tuner 110 and tuner 120 in order to extract the data stream B segments from the signals at both frequencies.

The dual-tuner approach shown in FIG. 1, however, can be cost-prohibitive. A frequency-diversity receiver using a single tuner could provide cost, space, and power savings. When a single tuner is time-shared between the first frequency and the second frequency, however, the system must reacquire the alternate signal during each transition interval. This involves retuning the local oscillator, setting band-switches, and re-establishing IFAGC and RFAGC voltages. Of these, re-establishing RFAGC can require the greatest amount of time, perhaps requiring hundreds of milliseconds. If the length of the transition interval is shorter than the time required to accurately set RFAGC, the RF gain setting for one frequency may be influenced by the setting for the other, degrading tuning performance for both.

Figure 2:
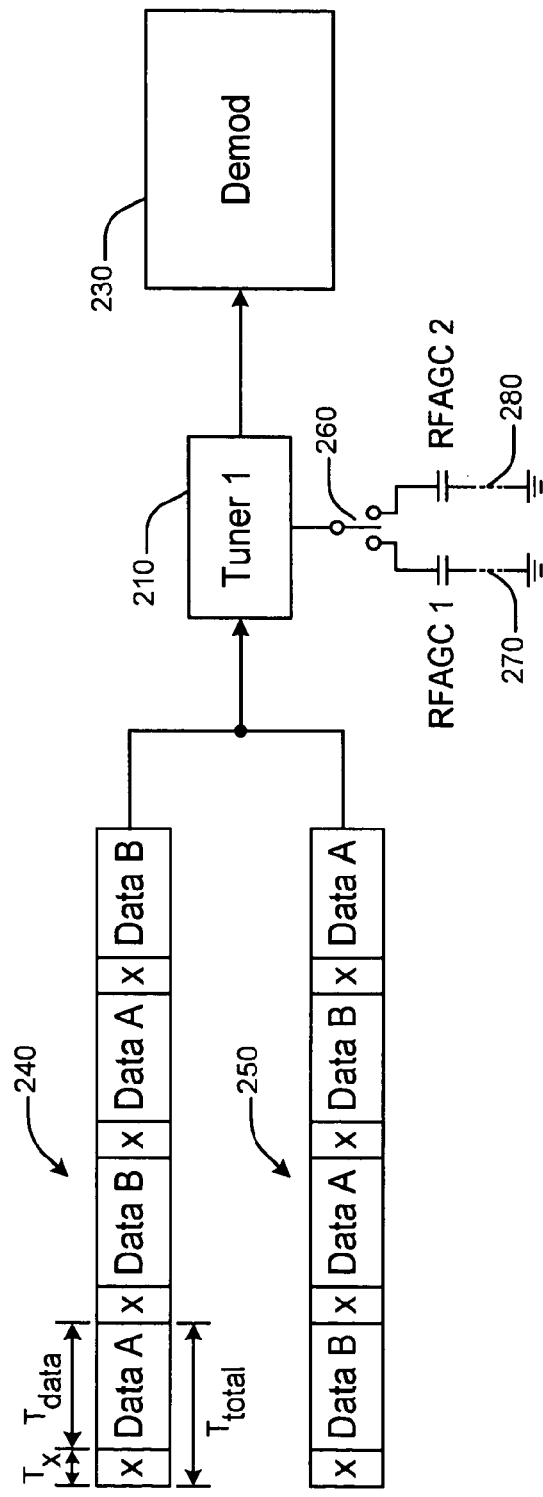
FIG. 2 is a block diagram of a portion of a television reception system with a single tuner for use in a frequency diversity transmission system.

FIG. 2 shows a portion of a receiver design which addresses this problem.

The system uses a single tuner 210 to tune both the first frequency, with multiplexed data stream 240, and the second frequency, with multiplexed data stream 250. Two RFAGC filter capacitors 270 and 280 are used, one for each of the two currently utilized frequencies. The capacitors are switched by switch 260 in tandem with the frequency selection. This allows each capacitor to maintain the RFAGC voltage related to its corresponding frequency until the tuner returns to that frequency.

During periods when tuner 210 is tuning the first frequency, switch 260 selects RFAGC capacitor 270. RFAGC levels are then set to optimize reception at the first frequency, which involves the setting of a corresponding charge level in capacitor 270. During the transition interval, tuner 210 switches to the second frequency and switch 260 is switched to select RFAGC capacitor 280. RFAGC levels are then set to optimize reception at the second frequency. At the next transition interval, tuner 210 is re-tuned to the first frequency and switch 260 is returned to the position selecting capacitor 270. With relatively short intervals between transitions, capacitor 270 will still be holding a charge corresponding to an appropriate RFAGC level for the last reception period for the signal at the first frequency, thereby generally reducing the time required for re-acquisition of the signal.

Figure 3:
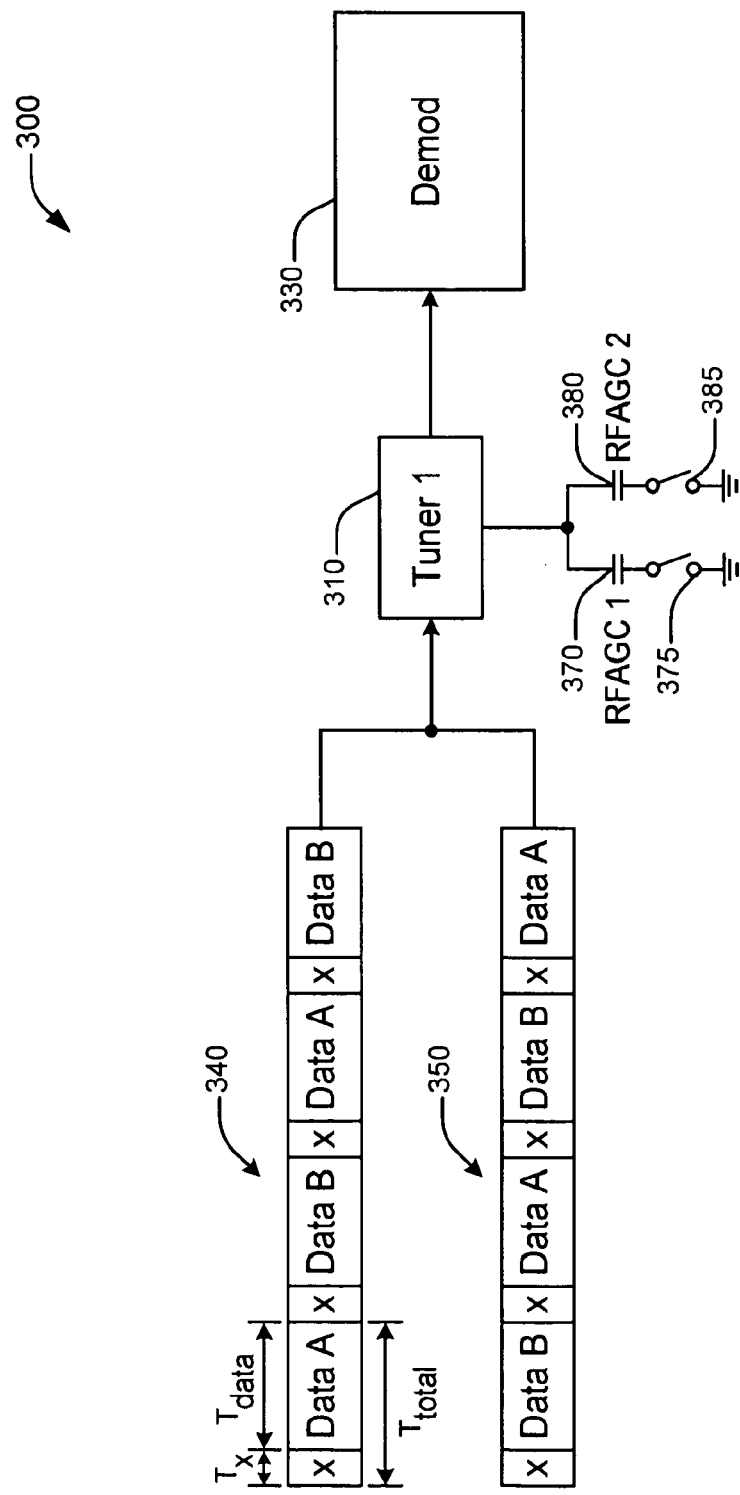
FIG. 3 is a block diagram of a portion of an alternative television reception system with a single tuner for use in a frequency diversity transmission system.

FIG. 3 shows an alternative reception system in accordance with the present invention. As with the system of FIG. 2, the system of FIG. 3 uses a single tuner 310 to tune both the first frequency, with multiplexed data stream 340, and the second frequency, with multiplexed data stream 350. Two RFAGC filter capacitors 370 and 380 are used, one for each of the two currently utilized frequencies. In this case, however, the capacitors are switched by switches 375 and 385 in tandem with the frequency selection.

When tuner 310 is tuned to the first frequency to receive data stream 340, switch 375 is closed and switch 385 is opened, causing the RFAGC process to affect capacitor 370. When tuner 310 is tuned to the second frequency to receive data stream 350, switch 375 is open and switch 385 is closed, causing the RFAGC process to affect capacitor 380. When the tuner returns to the first frequency, the switch positions are again reversed, and the voltage across capacitor 370 set during the previous tuning of the first frequency is used in the RFAGC process. This particular arrangement provides the advantage of allowing simple saturated transistor switches to be used for switches 375 and 385.

While the present invention has been described in terms of specific embodiments, it will be appreciated that modifications may be made which will fall within the scope of the invention. For instance, the concept may be expanded for use with more than two frequencies using corresponding numbers of RFAGC capacitors. This principle can also be extended to other slow acquisition-related processes within the system, such as carrier tracking loop locking and symbol-timing recovery. In each case, the system would have a means of storing an alternate set of values and would switch them in tandem with the diversity frequency.

The invention claimed is:

1. An apparatus comprising:
an input point receiving first and second radio frequency signals, said first radio frequency signal including a first multiplexed data stream, said second radio frequency signal including a second multiplexed data stream, each one of said first and second multiplexed data streams including redundant data derived from a plurality of primary data streams;
a tuner coupled to said input point operative to tune to one of said first and second radio frequency signals selectively in a time-shared manner;
an automatic gain control (AGC) filter coupled to said tuner, said AGC filter providing first and second AGC voltages for said tuner, said AGC filter including first and second capacitors, said first AGC voltage being provided by said first capacitor while said tuner is tuned to said first radio frequency signal, said second AGC voltage being provided by said second capacitor while said tuner is tuned to said second radio frequency signal, wherein
said first capacitor holds said first AGC voltage constant at a third voltage level during a first time interval in which said tuner re-tunes from said second radio frequency to said first radio frequency, said third voltage level being an AGC voltage level developed at said first capacitor during a latest previous reception of said first radio frequency signal; and
said second capacitor holds said second AGC voltage constant at a fourth voltage level during a second time interval in which said tuner re-tunes from said first radio frequency to said second radio frequency, said fourth voltage level being at an AGC voltage level developed at said second capacitor during a latest previous reception of said second radio frequency signal.

2. The apparatus of the claim 1 further comprising:
a switch coupled between a parallel combination of said first and second capacitors and said tuner;
said switch is operative to couple said first capacitor to said tuner and to decouple said second capacitor from said tuner while said tuner is tuned to said first radio frequency signal; and said switch is operative to couple said second capacitor to said tuner and to decouple said first capacitor from said tuner while said tuner is tuned to said second radio frequency.

3. The apparatus of the claim 1 further comprising:
a switch coupled between a parallel combination of said first and second capacitors and a source of reference potential;
said switch is operative to couple said first capacitor to said source of reference potential and to decouple said second capacitor from said source of reference potential while said tuner is tuned to said first radio frequency signal; and
said switch is operative to couple said second capacitor to said source of reference potential and to decouple said first capacitor from said source of reference potential while said tuner is tuned to said second radio frequency signal.

4. A method comprising:
receiving first and second radio frequency signals, said first radio frequency signal including a first multiplexed data stream, said second radio frequency signal including a second multiplexed data stream, each one of said first and second multiplexed data streams including redundant data derived from a plurality of primary data streams;
selectively tuning to one of said first and second radio frequency signals by a tuner in a time-shared manner;
providing first and second automatic gain control (AGC) voltages for said tuner, said first AGC voltage being provided by a first capacitor while tuning to said first radio frequency signal, said second AGC voltages being provided by a second capacitor while tuning to said second radio frequency signal, wherein said first capacitor holds said first AGC voltage constant at a third voltage level during a first time interval in which said tuner re-tunes from said second radio frequency to said first radio frequency, said third voltage level being an AGC voltage level developed at said first capacitor during a latest previous reception of said first radio frequency signal; and
said second capacitor holds said second AGC voltage constant at a fourth voltage level during a second time interval in which said tuner re-tunes from said first radio frequency to said second radio frequency, said fourth voltage level being at an AGC voltage level developed at said second capacitor during a latest previous reception of said second radio frequency signal.

5. The method of the claim 4, further comprising:
coupling said first capacitor to said tuner and decoupling said second capacitor from said tuner while tuning to said first radio frequency signal; and
coupling said second capacitor to said tuner and decoupling said first capacitor from said tuner while tuning to said second radio frequency.

6. The method of the claim 4, further comprising:
coupling said first capacitor to said source of reference potential and decoupling said second capacitor from said source of reference potential while tuning to said first radio frequency signal; and
coupling said second capacitor to said source of reference potential and decoupling said first capacitor from said source of reference potential while tuning to said second radio frequency signal.

* * * * *